(12) United States Patent
Lehmann et al.

(10) Patent No.: US 11,150,734 B2
(45) Date of Patent: Oct. 19, 2021

(54) HAPTIC STRUCTURE FOR PROVIDING LOCALIZED HAPTIC OUTPUT

(71) Applicant: Apple Inc., Cupertino, CA (US)

(72) Inventors: Alex J. Lehmann, Sunnyvale, CA (US); Juan Pu, Livermore, CA (US); Paul X. Wang, Cupertino, CA (US); Qiliang Xu, Cupertino, CA (US); Zheng Gao, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/802,145

(22) Filed: Feb. 26, 2020

(65) Prior Publication Data

US 2020/0192484 A1 Jun. 18, 2020

Related U.S. Application Data

(63) Continuation of application No. 15/416,466, filed on Jan. 26, 2017, now Pat. No. 10,591,993.

(Continued)

(51) Int. Cl.
*G06F 3/02* (2006.01)
*H01L 41/09* (2006.01)
(Continued)

(52) U.S. Cl.
CPC ............ *G06F 3/016* (2013.01); *G06F 3/0202* (2013.01); *G06F 3/03543* (2013.01);
(Continued)

(58) Field of Classification Search
CPC .... H01L 41/09; H01L 41/113; H01L 41/1136; H01L 41/094; H01L 41/1132;
(Continued)

(56) References Cited

U.S. PATENT DOCUMENTS 6,198,206 B1 3/2001 Saarmaa
6,437,485 B1 * 8/2002 Johansson ........... H01L 41/0946
310/328

(Continued)

FOREIGN PATENT DOCUMENTS

AU 2016100399 5/2016
EP 2207080 7/2010

(Continued)

OTHER PUBLICATIONS

Corning. Willow (TM) Glass Fact Sheet. (Year: 2012).*

(Continued)

*Primary Examiner* — Julie Anne Watko
(74) *Attorney, Agent, or Firm* — Brownstein Hyatt Farber Schreck, LLP

(57) ABSTRACT

Disclosed herein are structures, devices, methods and systems for providing haptic output on an electronic device. In some embodiments, the electronic device includes a display portion, a housing pivotally coupled with the display portion and comprising a glass sheet that defines an input surface of the electronic device. The input surface can define a keyboard having a set of key regions arranged along the glass sheet. The electronic device may also include a haptic mechanism positioned beneath a key region of the set of key regions that includes a substrate defining a beam structure having first and second fixed ends, a spacer positioned along a first side of the beam structure and a piezoelectric element positioned along a second side of the beam structure. The piezoelectric element can be configured to deflect the beam structure to provide haptic output along the input surface.

16 Claims, 15 Drawing Sheets

Related U.S. Application Data

(60) Provisional application No. 62/397,541, filed on Sep. 21, 2016.

(51) Int. Cl.
*G06F 3/041* (2006.01)
*H01L 41/113* (2006.01)
*G06F 3/0354* (2013.01)
*G06F 3/01* (2006.01)

(52) U.S. Cl.
CPC ...... *G06F 3/03545* (2013.01); *G06F 3/03547* (2013.01); *G06F 3/041* (2013.01); *H01L 41/09* (2013.01); *H01L 41/0933* (2013.01); *G06F 2203/04105* (2013.01); *H01L 41/094* (2013.01); *H01L 41/113* (2013.01); *H01L 41/1132* (2013.01); *H01L 41/1134* (2013.01); *H01L 41/1136* (2013.01)

(58) Field of Classification Search
CPC ............. H01L 41/1134; H01L 41/0933; H01L 41/0906; H01L 41/0926; H01L 41/0946; H01L 41/0973; H01L 41/098; H01L 41/0986; H01L 41/18; H01L 41/25; H01L 41/27; G06F 3/03543; G06F 3/03545; G06F 3/03547; G06F 3/0202; G06F 3/016; G06F 3/041; G06F 2203/04105; G06F 3/0414; G06F 3/0216; G06F 3/021; G06F 3/02; G06F 3/014; G06F 3/00; G06F 3/0233; G06F 3/0234; G06F 3/0354; G06F 3/033; G06F 3/0412; G06F 2203/04106; G08B 6/00; B06B 1/045; B06B 1/0603; B06B 1/06; B06B 1/0644; B06B 1/0688
See application file for complete search history.

(56) References Cited

U.S. PATENT DOCUMENTS

| | | | |
|---|---|---|---|
| 6,965,189 | B2 | 11/2005 | Menzel |
| 7,205,978 | B2 | 4/2007 | Poupyrev |
| 8,339,250 | B2 | 12/2012 | Je et al. |
| 8,345,013 | B2 | 1/2013 | Heubel et al. |
| 8,395,587 | B2 | 3/2013 | Cauwels et al. |
| 8,593,409 | B1 | 11/2013 | Heubel |
| 8,686,952 | B2 | 4/2014 | Burrough et al. |
| 9,595,659 | B2 | 3/2017 | Kim |
| 9,600,070 | B2 | 3/2017 | Chatterjee et al. |
| 9,612,674 | B2 | 4/2017 | Degner et al. |
| 9,733,746 | B2 | 8/2017 | Colgate et al. |
| 10,208,158 | B2 | 2/2019 | Banister et al. |
| 2007/0152974 | A1 | 7/2007 | Kim |
| 2009/0002328 | A1 | 1/2009 | Ullrich et al. |
| 2009/0160763 | A1* | 6/2009 | Cauwels ............... G06F 3/016 345/156 |
| 2010/0090813 | A1* | 4/2010 | Je ........................... G06F 3/016 340/407.2 |
| 2012/0162143 | A1 | 6/2012 | Kai |
| 2013/0127607 | A1 | 5/2013 | Parker |
| 2014/0082490 | A1 | 3/2014 | Jung et al. |
| 2014/0139450 | A1 | 5/2014 | Levesque |
| 2014/0168799 | A1 | 6/2014 | Hubert et al. |
| 2014/0208204 | A1 | 7/2014 | Lacroix et al. |
| 2014/0320431 | A1 | 10/2014 | Cruz-Hernandez et al. |
| 2014/0340208 | A1* | 11/2014 | Tan ........................ H01H 13/83 340/407.2 |
| 2015/0169118 | A1 | 6/2015 | Lee et al. |
| 2015/0309573 | A1 | 10/2015 | Brombach et al. |
| 2016/0154500 | A1 | 6/2016 | Baek |
| 2016/0209958 | A1 | 7/2016 | Choi et al. |
| 2016/0370862 | A1 | 12/2016 | Colgate et al. |
| 2017/0068318 | A1 | 3/2017 | McClure |
| 2017/0153703 | A1* | 6/2017 | Yun ........................ G06F 3/041 |
| 2017/0155038 | A1 | 6/2017 | Caraveo |
| 2017/0308171 | A1 | 10/2017 | Kamata et al. |
| 2017/0315618 | A1 | 11/2017 | Ullrich |
| 2017/0345992 | A1 | 11/2017 | Noguchi |
| 2017/0372565 | A1 | 12/2017 | Do |
| 2018/0081438 | A1 | 3/2018 | Lehmann et al. |
| 2018/0081441 | A1 | 3/2018 | Pedder |
| 2018/0120938 | A1 | 5/2018 | Frescas |
| 2018/0143689 | A1 | 5/2018 | Heubel |
| 2018/0218859 | A1* | 8/2018 | Ligtenberg ............. G06F 1/165 |

FOREIGN PATENT DOCUMENTS

| | | |
|---|---|---|
| JP | 2013149124 | 8/2013 |
| JP | 2015153406 | 8/2015 |
| WO | WO 16/141482 | 9/2016 |

OTHER PUBLICATIONS

PuntoCellulare, "LG-GD910 3G Watch Phone," YouTube, https://www.youtube.com/watch?v=HcCi87KIELM, Jan. 8, 2009 (and screenshots captured by Examiner on Jun. 18, 2018 from said video).

Sullivan, This Android Wear Update Turns Your Device into The Dick Tracy Watch, Fast Company, https://www.fastcompany.com/3056319/this-android-wear-update-turns-your-device-into-the-dick-tracy-watch, Feb. 4, 2016.

* cited by examiner

HAPTIC STRUCTURE FOR PROVIDING LOCALIZED HAPTIC OUTPUT

CROSS-REFERENCE TO RELATED APPLICATIONS

This application is a continuation of U.S. patent application Ser. No. 15/416,466, filed Jan. 26, 2017, and titled "Haptic Structure for Providing Localized Haptic Output," which is a non-provisional patent application of and claims the benefit of U.S. Provisional Patent Application No. 62/397,541, filed Sep. 21, 2016, and titled "Haptic Structure or Providing Localized Haptic Output," the disclosures of which are hereby incorporated herein by reference in their entirety.

FIELD

The present disclosure generally relates providing haptic output for an electronic device. More specifically, the present disclosure is directed to using a haptic structure for providing localized haptic output for an electronic device.

BACKGROUND

Electronic devices are commonplace in today's society. Example electronic devices include cell phones, tablet computers, personal digital assistants, and the like. Some of these electronic devices include a haptic actuator that provides haptic output to a user. The haptic output may be provided by an actuator that utilizes a vibratory motor or an oscillating motor. However, these vibratory motors typically vibrate the entire electronic device and are not able to provide a haptic output at a specific area.

SUMMARY

Disclosed herein is a haptic structure for providing localized haptic output and tactile sensations for an electronic device. In some embodiments, the haptic structure includes a beam structure or other deflection mechanism that is machined from or within a surface or some other component (e.g., a housing component) of the electronic device. The beam structure is coupled to a piezoelectric element and is configured to deflect in different directions, depending on the current, voltage or other input signal that is applied to the piezoelectric element. As the beam structure deflects, a surface of the electronic device may also deflect; this causes a haptic output that creates a tactile sensation. In some embodiments, the haptic output may be provided to an input surface (e.g., a surface, structure, or the like designed to receive an input from a user).

More specifically, described herein is an electronic device having an input surface including a haptic structure. The electronic device, may include: an input surface; a haptic structure operably connected to the input surface and comprising: a substrate defining a beam structure; a spacer coupled to a first side of the beam structure; and a piezoelectric element coupled to a second side of the beam structure; wherein the piezoelectric element is configured to deflect the beam structure in a first direction to provide a first haptic output in response to a first input signal applied to the piezoelectric element; and the piezoelectric element is configured to deflect the beam structure in a second direction to provide a second haptic output in response to a second input signal applied to the piezoelectric element.

Also described is a haptic structure for an electronic device. The haptic structure includes a surface defining a first deflection mechanism and a second deflection mechanism; a first actuation element coupled to the first deflection mechanism; a second actuation element coupled to the second deflection mechanism; and a substrate coupled to the first deflection mechanism and the second deflection mechanism; wherein the substrate is operable to deflect in response to of one or both of the first and second deflection mechanisms deflecting.

The present disclosure also describes an electronic device having an input surface and a haptic structure provided below the input surface. The haptic structure is operable to selectively provide haptic output at different locations on the input surface. The haptic structure includes a first beam structure formed at a first location beneath the input surface, a first spacer coupled to the first beam structure and a first portion of the input surface, and a first piezoelectric element coupled the first beam structure. The first piezoelectric element is operable to cause the first beam structure and the first portion of the input surface to deflect in response to a first received input. The haptic structure also includes a second beam structure formed at a second location beneath the input surface, a second spacer coupled to the second beam structure and a second portion of the input surface, and a second piezoelectric element. The second piezoelectric element is coupled the second beam structure and is operable to cause the second beam structure and the second portion of the input surface to deflect in response to a second received input.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
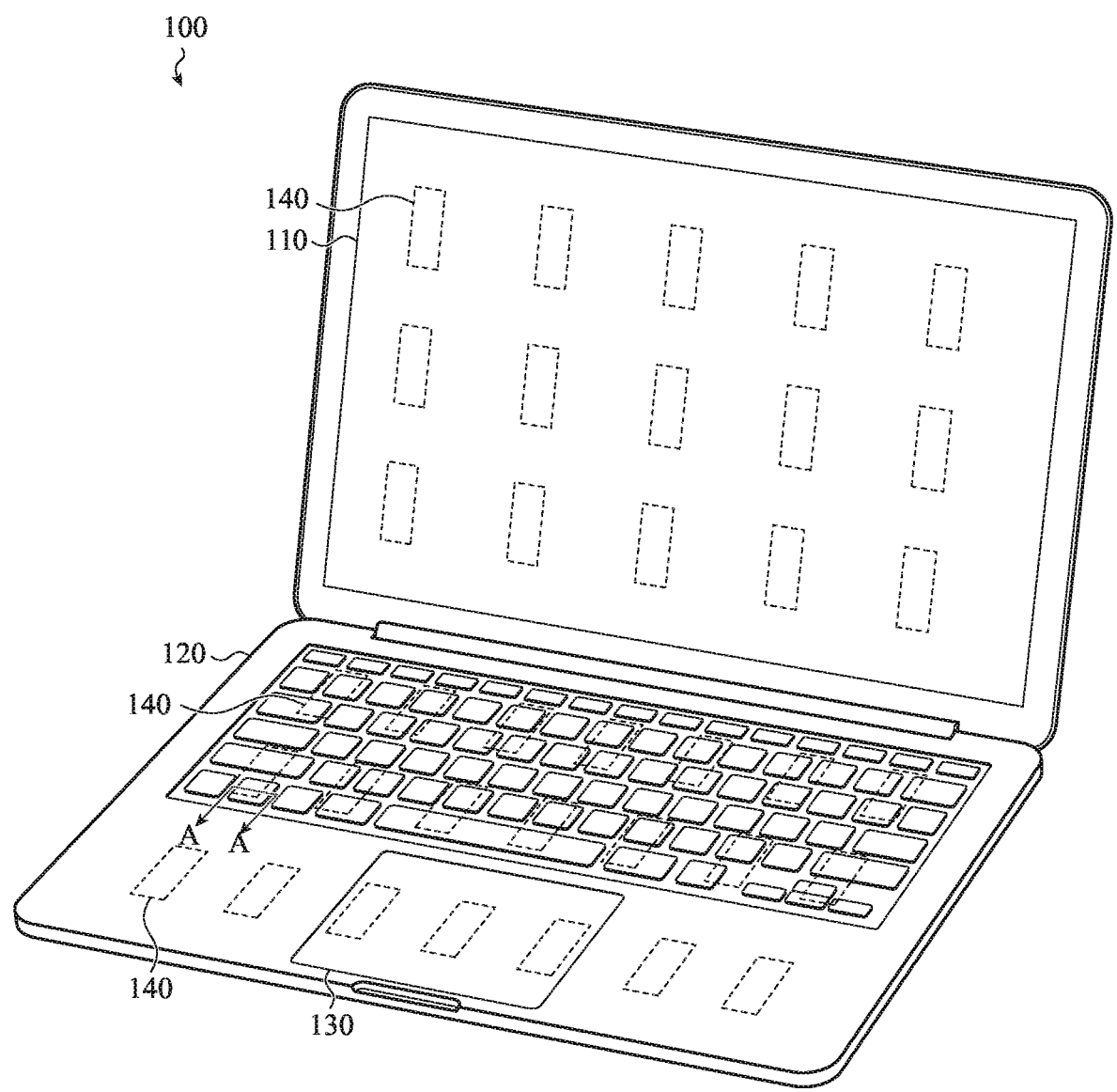
FIG. 1A illustrates an example electronic device that may use or incorporate a haptic structure that provides haptic output.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to providing global haptic output and localized haptic output on a surface an electronic device. As used herein, the term "global haptic output" means that the haptic structure provides haptic output, and so tactile sensations, on an entire surface of the electronic device in or under which the haptic structure is located. Likewise, the term "localized haptic output" means that the haptic structure provides haptic output on a portion of the surface of the electronic device in or under which the haptic structure is located. The surface may be an input surface configured to accept a user input, for example.

The haptic output provided by the haptic structure may be a discrete output or a continuous output. For example, the haptic structure may provide a discrete haptic output to simulate a key or button actuation. In other implementations, the haptic structure may provide a continuous output such as a vibration. The vibration may be used to simulate a texture as a user moves an input mechanism (e.g., a stylus, finger, or the like) over an input surface of the electronic device.

In addition to the specific examples given above, the haptic structure may provide localized haptic output or global haptic output in response to any number of events associated with the electronic device. Such events include, but are not limited to, an event associated with an application that is executing on the electronic device, a button or key press, rotation of a dial, crown or knob, an alarm, a displayed image, an incoming or outgoing electronic message, an incoming or outgoing telephone call, and the like.

Further, although an electronic device is specifically mentioned and shown in the figures, the haptic structure described herein may be included in various electronic devices, mechanical devices, electromechanical devices and so on. For example, the haptic structure may be included on a stylus, a mouse, a knob, a steering wheel, a dashboard, a band for a wearable electronic device, a wearable deice (such as a watch), gloves, glasses and other wearable devices, and so on.

Unlike conventional haptic actuators that utilize vibratory or oscillating motors, the haptic structure of the present disclosure includes one or more beam structures or deflection mechanisms. The beam structures may be formed from or within a substrate, input surface, or other portion of the device. For example, the beam structure may be defined by first and second apertures in a substrate or surface of the electronic device. The apertures are typically (although not necessarily) parallel and spaced apart from one another. In some implementations, the apertures are arranged such that opposing ends of the beam structure are fixed with respect to the substrate or surface. In some embodiments, the apertures may be tapered, angled with respect to one another, curved or otherwise non-linear, and so on, rather than parallel apertures.

Sample substrates include exterior surfaces of an electronic device, support structures within an electronic device, plates or the like within an electronic device, and so on. The substrate is generally the structure on or from which haptic actuators are formed, while the "surface" is the structure through which haptic outputs are transmitted. In some embodiments the substrate and surface may be the same. For example, one or more haptic actuators may be formed from or on one side of a material while a user interacts with a second side of the material. Thus, the material may serve as both surface and substrate.

In the embodiments described herein, a beam structure having fixed opposing ends is referred to as a "fixed beam structure." In another embodiment, the beam structure may have one end that is fixed with respect to the substrate while the other end is not. In the embodiments described herein, the beam structure having one fixed end is referred to as a "cantilevered beam structure."

As will be described below, each of the beam structures described herein include a piezoelectric element that causes the beam structure to deflect. The direction of deflection is dependent on a received input signal. For example, the beam structure may deflect in a first direction in response to a first received input signal and may deflect in a second direction in response to a second received input signal. Each received input signal may individually be a voltage signal, a current signal or any other suitable input signal.

In some embodiments, the beam structure may be coupled to a surface. As the beam structure deflects, the surface, or portions of the surface, may also deflect or bend. For example, if the beam structure deflects in an upward direction, the surface also deflects in the upward direction. Likewise, if the beam structure deflects in a downward direction, the surface also deflects in the downward direction. Deflection of the beam structure and/or the surface causes the haptic output and corresponding tactile sensation.

For example, the beam structure may be flat when in its nominal state. As an input signal is applied to the piezoelectric element, the beam structure may bow convexly or concavely. When a surface is coupled to the beam structure, the deflection of the beam structure causes the surface to deflect or otherwise move. Movement of the surface in this manner provides a haptic output that can be felt by a person touching the surface. A surface may thus act as both an input surface and output surface, insofar as it may receive user input and provide haptic output.

In some embodiments, a haptic structure may include a single beam structure having a single piezoelectric element.

In other cases, the beam structure may have two or more piezoelectric elements. In still other cases, the haptic structure may include two or more beam structures, and each beam structure may have a single piezoelectric element or multiple piezoelectric elements. In addition, a haptic structure may include fixed beam structures and cantilevered beam structures, either of which may be associated with a piezoelectric element(s).

The beam structures may be positioned at different areas or regions. For example, one or more cantilevered beam structures may be positioned on a peripheral portion of the haptic structure while one or more fixed beam structures may be positioned on an inner portion of the haptic structure. Each of the beam structures may be actuated simultaneously, substantially simultaneously and/or sequentially in order to provide different types of haptic output.

For example, a first input signal may be provided to the piezoelectric element of a first beam structure at a first time to cause the first beam structure to provide a first haptic output at a first location. A second input signal may be provided to the piezoelectric element of a second beam structure at the same time or at a different time to cause the second beam structure to provide a second haptic output at a second location.

In some embodiments, the beam structures may be integrated within a housing, or a portion of the housing, of the electronic device. For example, if the electronic device includes a keyboard, a touchpad or other such input mechanism, the haptic structure may be integrated into the keyboard (e.g., a top case of the keyboard) or the touchpad. In other implementations, the haptic structure may be integrated within a display of an electronic device.

The haptic structure may also be used in conjunction with a force-sensing element. For example, the haptic structure and a force-sensing element may be incorporated into a single electronic device. Thus, the force-sensing element may be operative to detect force input received on an input surface of the electronic device and the haptic structure may provide haptic output on the input surface of the electronic device. In other implementations, the piezoelectric element may be configured to determine an amount of force provided on the input surface of the electronic device.

These and other embodiments are discussed below with reference to FIGS. 1A-9. However, those skilled in the art will readily appreciate that the detailed description given herein with respect to these Figures is for explanatory purposes only and should not be construed as limiting.

Figure 1B:
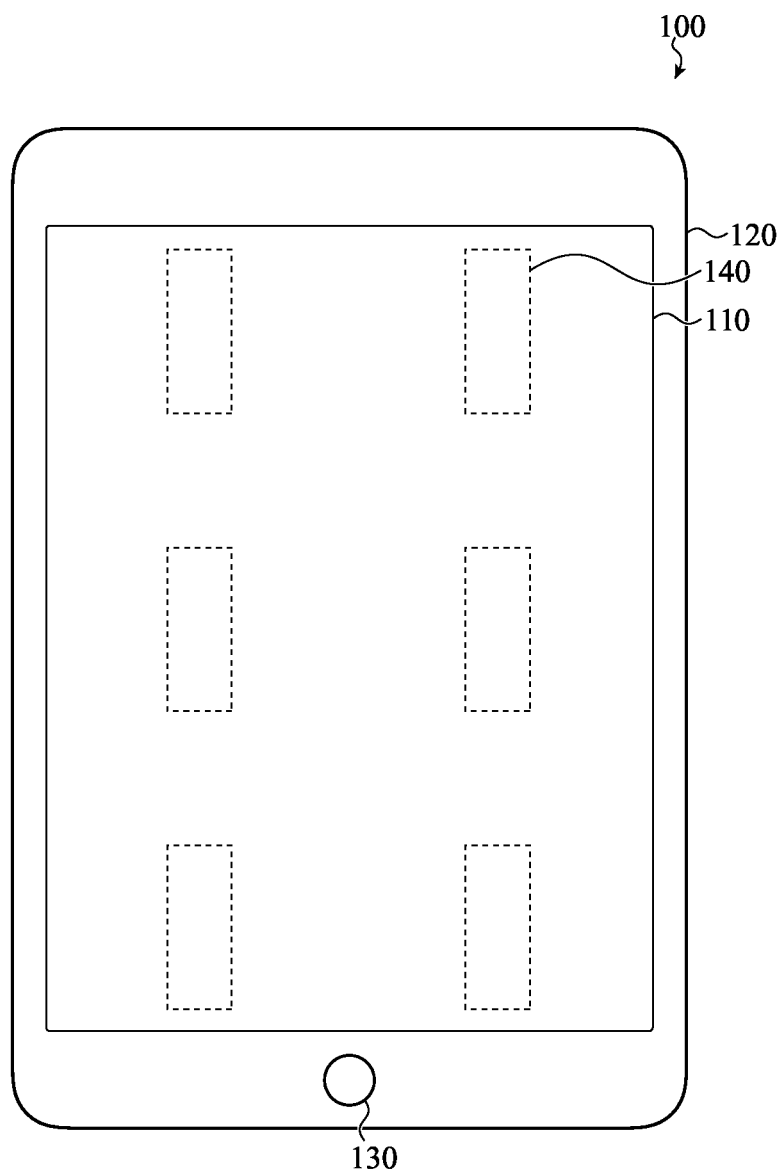
FIG. 1B illustrates another example electronic device that may use or incorporate a haptic structure that provides haptic output.

FIG. 1A illustrates an example electronic device 100 that may incorporate a haptic structure 140 according to one or more embodiments of the present disclosure. The haptic structure 140 may provide a haptic output for the electronic device 100. As shown in FIG. 1A, the electronic device 100 may be a laptop computing device. In other implementations, the electronic device 100 may be a tablet computing device such as shown in FIG. 1B. Although FIGS. 1A-1B show different electronic devices 100, like reference numerals are used to designate similar components. For example, each electronic device 100 may include a display. As such, reference numeral 110 is used to designate the display of each electronic device 100.

Further, although specific electronic devices are shown in the figures and described below, the haptic structure described herein may be used with various electronic devices including, but not limited to, mobile phones, personal digital assistants, a time keeping device, a health monitoring device, a wearable electronic device, an input device (e.g., a stylus), a desktop computer, electronic glasses, and so on. Although various electronic devices are mentioned, the haptic structure 140 of the present disclosure may also be used in conjunction with other products and combined with various materials.

For example, the haptic structure 140 may be used on a band of wearable electronic device, a dashboard for an automobile, a steering wheel for an automobile, a housing of an electronic device, a keyboard and so on. Use of the haptic structure described herein may replace conventional rotary or linear actuators. As a result, the profile of the electronic device may be smaller and/or thinner.

The electronic device 100 may include a display 110, a housing 120, and one or more input mechanisms 130. In some embodiments, the input mechanism 130 may be a touch-sensitive input device such as a trackpad, a keyboard, and so on. The display 110, the housing 120, and the one or more input mechanisms 130 may be coupled to a haptic structure 140 such that haptic output is provided directly on each component. For example, the haptic structure 140 may be provided underneath (or otherwise coupled to) the display 110, including a cover glass that is part of the display 110. Thus, when a beam structure or deflection mechanism of the haptic structure 140 is actuated, the display 110 (and, in some embodiments only the cover glass) also deflects to provide the haptic output.

In some embodiments, the display 110 may be a touch-sensitive display that detects and measures the location of a touch on an input surface of the display 110. Thus, when a touch sensor detects the location of the touch, an electronic signal may drive one or more haptic structures 140 at the detected location, thereby generating haptic output at that location.

The touch sensor may be a capacitive-based touch sensor that is disposed relative to the display 110 or a display stack of the electronic device 100. Although a capacitive-based touch sensor is disclosed, other sensors may be used.

The electronic device 100 may also include a force-sensing element that uses a force sensor to detect and measure the magnitude of force of a touch on a surface of the electronic device 100. The surface may be, for example, the display 110, a track pad, or some other input device or input surface, or may be a surface that is not designed or intended to accept input.

The haptic structure 140 of the present disclosure may be combined or otherwise integrated with the touch sensor or the force sensor and may provide both input and output capabilities. For example, the haptic structure 140 may provide haptic output at or near the location of any detected touch input. The haptic structure 140 may also provide various types of haptic output depending on the detected amount of force. In addition, the haptic structure may be used to detect a received amount of force such as will be described below.

The electronic device 100 may include a housing 120 that encloses one or more components of the electronic device 100. The housing 120 may also be coupled to or may otherwise incorporate one or more haptic structures 140. For example, one or more beam structures of the haptic structure 140 may formed within the housing 120 of the electronic device 100.

The haptic structure 140 may also be used in conjunction with or be coupled to the input mechanism 130. For example, one or more haptic structures 140 may be coupled to a trackpad and/or a force sensitive input device of an electronic device 100.

The haptic structure 140 disclosed herein may also be used in place of the input mechanism 130, or as an additional input mechanism. For example, a haptic structure 140 may be placed on, underneath or otherwise integrated with the housing 120, a cover glass, and/or a display 110 of the electronic device 100 and be used to detect received input.

In one implementation, when a force is received at or near the location of the haptic structure 140, the haptic structure 140 may generate a voltage or current that is measurable by an electronic component of the electronic device 100. A processing element may sense this charge (or current) and accept it as an input. Such an input may be binary (e.g., counted as an input if the charge or current exceeds a threshold) or variable across a continuum (e.g., different generated charges/currents equate to different inputs or differences in a particular type of input).

To continue the example, the amount of current or voltage generated by the haptic structure 140 may vary based on the type of input received. For example, if an amount of current generated or detected is above a first threshold, it may indicate that a first type of touch input is received (e.g., a quick touch or press). If an amount of current generated or detected is above a second threshold, it may indicate that a second type of touch input is received (e.g., a long touch or press).

The haptic structure 140 may also work in conjunction with one or more force-sensing elements or one or more force sensors to determine an amount of force that is applied to an input surface (or other surface) of the electronic device 100. In addition, the haptic structure 140 may be used to determine the location of the received input, and to determine one or more gestures associated with the received input. For example, if a haptic structure or a series of haptic structures detect touch input over a certain time period and over a certain distance on a surface of the electronic device 100, a swipe gesture may be detected.

Figure 2A:
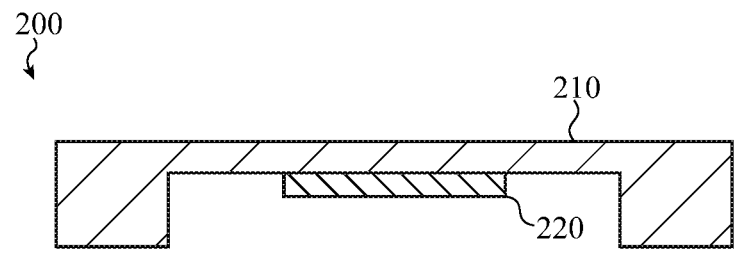
FIG. 2A illustrates an example haptic structure in an inactive state.
Figure 2B:
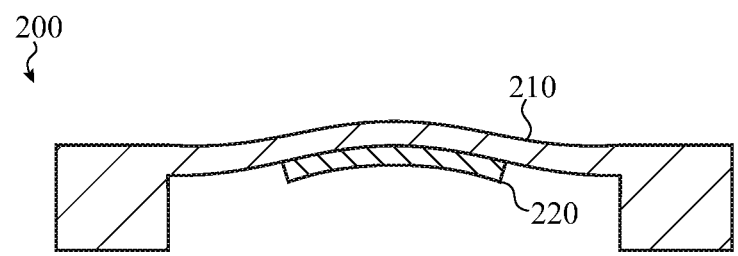
FIG. 2B illustrates the example haptic structure of FIG. 2A in a first active state.
Figure 2C:
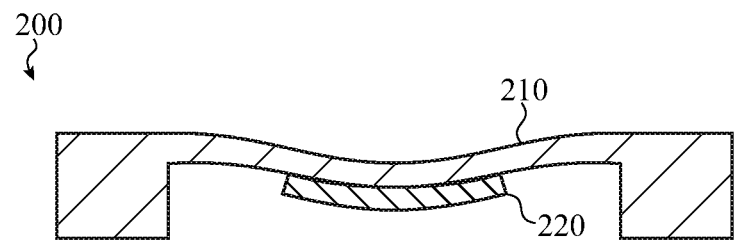
FIG. 2C illustrates the example haptic structure of FIG. 2A in a second active state.

FIG. 2A illustrates an example haptic structure 200 for an electronic device in an inactive state. FIG. 2B illustrates the example haptic structure 200 of FIG. 2A in a first active state and FIG. 2C illustrates the example haptic structure 200 of FIG. 2A in a second active state. The haptic structure 200 may be used with the example electronic devices 100 shown and described above with respect to FIGS. 1A-1B.

The haptic structure 200 may include a deflection mechanism 210. The haptic structure 200 may be referred to as a fixed beam structure as both ends of the deflection mechanism 210 are coupled to, formed within or are otherwise integrated with a surface (such as an input surface or, in some cases, a substrate) that makes up the haptic structure 200. For example, the deflection mechanism 210 may be defined by two or more parallel apertures extending through by the substrate such as will be shown and described below.

The deflection mechanism 210 may be approximately 0.3 mm-0.5 mm thick, approximately 7 mm-9 mm wide and approximately 45 mm long although other dimensions may be used. In addition, a first portion of the deflection mechanism 210 may have a first dimension while a second portion of the deflection mechanism 210 has a second, different dimension. For example, a first portion of the deflection mechanism 210 may have a first thickness while a second portion of the deflection mechanism 210 may have a second thickness.

The haptic structure 200 also includes an actuation element 220. The actuation element 220 may be coupled to a one side of the deflection mechanism 210. In some implementations, the actuation element 220 is a piezoelectric material. In other implementations, the actuation element 220 may be any type of actuator that moves or that can be driven by an input signal (e.g., an electrical signal such as a current or voltage, light signal, or other input) to cause the deflection mechanism 210 to move or deflect along an axis.

For example, when a first input signal is applied to the actuation element 220, the actuation element 220 may cause the deflection mechanism 210 to have a concave shape such as shown in FIG. 2B. When a second input signal is applied to the actuation element 220, the actuation element may cause the deflection mechanism 210 to have a convex shape such as shown in FIG. 2C. Each time the deflection mechanism 210 deflects, a haptic output may be provided.

In some embodiments, the actuation element 220 may be driven to produce a discrete haptic output or may be driven to produce continuous haptic output. Additionally, the actuation element 220 may be driven at a range of frequencies to produce different types and intensities of haptic output. For example, the actuation element 220 may be driven at frequencies of 1 Hz up to 1 kHz or more.

Although not shown in FIG. 2A, a spacer may be affixed to a different side of the deflection mechanism 210 and may couple the deflection mechanism 210 to a surface. The surface may be a cover glass of an electronic device, a housing of the electronic device, and so on. Because the surface is coupled to the deflection mechanism 210, as the deflection mechanism 210 deflects, the surface may also deflect and provide a haptic output.

Although the haptic structure 200 is specifically discussed with respect to an electronic device, the haptic structure 200 may be used with other devices including mechanical devices and electrical devices, as well as non-mechanical and non-electrical devices such as described herein.

Figure 3A:
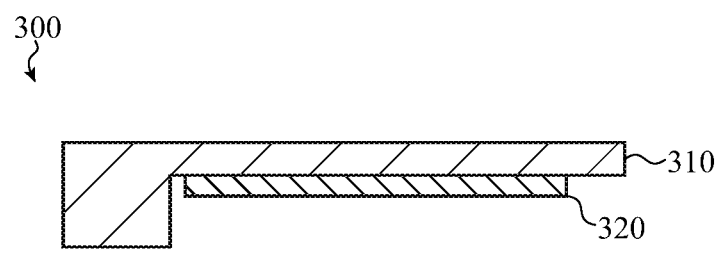
FIG. 3A illustrates another example haptic structure in an inactive state.

FIG. 3A illustrates another example haptic structure 300 for an electronic device. The haptic structure 300 may be referred to as a cantilevered beam structure as one end of the deflection mechanism 310 is coupled to, machined from, or otherwise integrated with a substrate of the haptic structure 300 while the other end of the deflection mechanism 310 is free.

The haptic structure 300 also includes an actuation element 320, which may be a piezoelectric actuator or the like. The deflection mechanism 310 and the actuation element 320 may operate in a similar manner to the deflection mechanism 210 and the actuation element 220 described above.

Figure 3B:
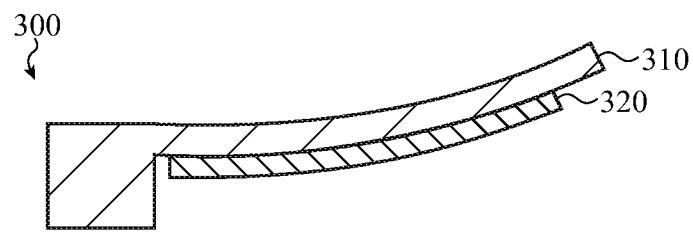
FIG. 3B illustrates the example haptic structure of FIG. 3A in a first active state.
Figure 3C:
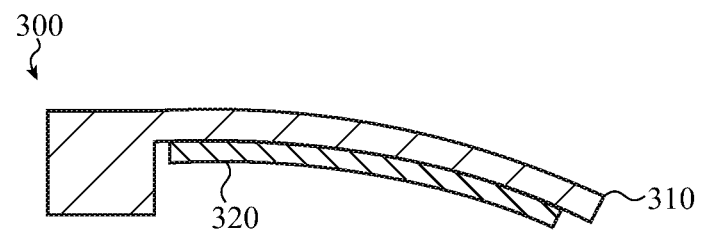
FIG. 3C illustrates the example haptic structure of FIG. 3A in a second active state.

For example, when a first input signal is applied to the actuation element 320, the deflection mechanism 310 may move in a first direction such as shown in FIG. 3B. Likewise, when a second input signal current is applied to the actuation element 320, the deflection mechanism 310 may move in a second direction such as shown in FIG. 3C. As shown, the second direction is generally opposite the first direction.

Deflection of the deflection mechanism 310 in the manner described may provide a haptic output to a user of the electronic device. More specifically, as the deflection mechanism 310 deflects, one or more portions of the electronic device that incorporates the haptic structure 300 may also deflect.

Figure 4A:
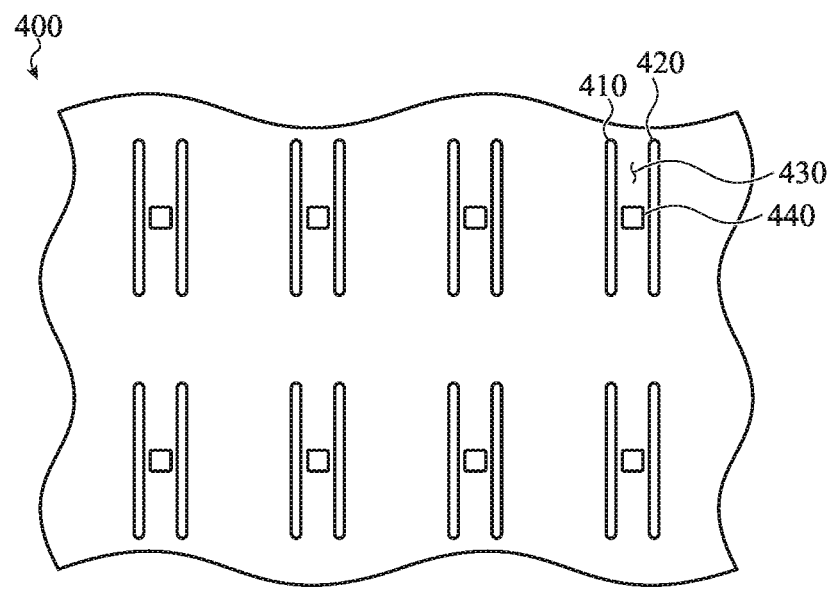
FIG. 4A illustrates a top view of a set of example haptic structures.

FIG. 4A illustrates a top down view of an example haptic structure 400. The haptic structure 400 may include a number of fixed beam structures such as described above. More specifically, the haptic structure 400 may include a substrate (which may be an input surface, housing, or interior element of an electronic device such as a support plate) that defines a first aperture 410 and a second aperture 420. The first aperture 410 is spaced apart from and parallel with respect to the second aperture 420. The first aperture 410 and the second aperture may be machined from the substrate to form the beam structure 430. For example, the first aperture 410 and the second aperture 420 may extend entirely or partially through the surface of the haptic structure 400 to form or otherwise define a beam structure 430.

As described above, the beam structures 430 shown in FIG. 4A are fixed beam structures as the first aperture 410 and the second aperture 420 are configured such that the opposing ends of the beam structures 430 are fixed or otherwise integrated with the surface of the haptic structure 400. However, although the beam structures 430 are shown and described as being integrated with or otherwise formed in the surface of the haptic structure 400, the beam structures 430 may be separate components. For example, one or more apertures, channels or openings may be formed in the surface of the haptic structure 400 and the beam structures 430 may be placed over or within the aperture.

In the example shown, the haptic structure 400 includes a 2×4 array of beam structures 430. However, the size of the haptic structure 400 as well as the number of beam structures 430 is scalable. As such, a haptic structure 400 may include any number of beam structures 430 arranged in various configurations. For example, a haptic structure 400 having a first array of beam structures may be used for one electronic device while a haptic structure 400 having a second array of beam structures 430 may be used for a different computing device. It should also be noted that a single electronic device may have haptic structures with varying arrays of beam structures.

In some embodiments, the haptic structure 400 may include a spacer 440. The spacer may be coupled to a first side of the beam structure 430. The spacer 440 may be used to couple the beam structure 430 to an output surface (e.g., surface 510 of FIG. 5A). The spacer 440 may be an energy absorbing material such as a polyurethane material. The spacer 440 may also have an adhesive material that couples the beam structure 430 to the surface. As described above, when the beam structure 430 deflects, the surface may also deflect to provide a haptic output.

Figure 4B:
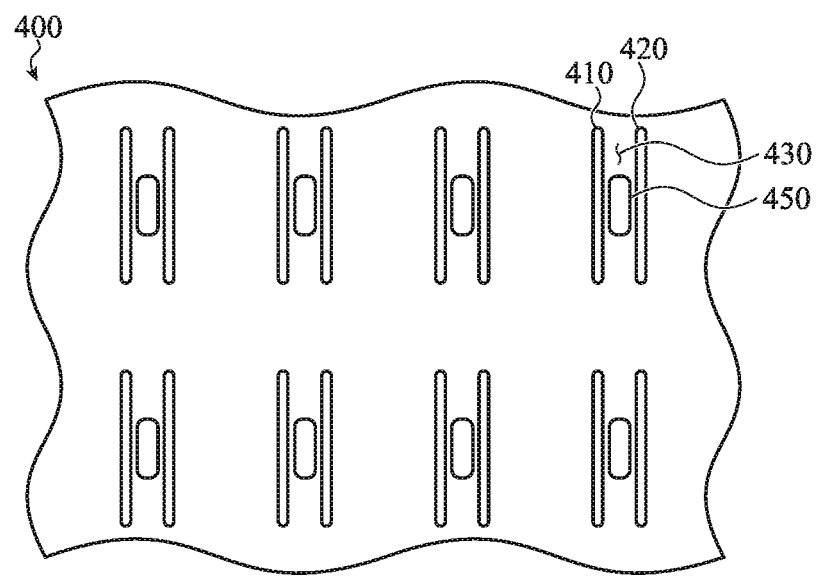
FIG. 4B illustrates a bottom view of the example haptic structures of FIG. 4A.

FIG. 4B illustrates a bottom view of the haptic structure 400. As shown in FIG. 4B, a piezoelectric element 450 may be provided on an underside of each beam structure 430. When an input signal is applied to the piezoelectric element 450, one or more dimensions of the piezoelectric element 450 may change. For example, when a first input signal is applied to the piezoelectric element 450, a length of the piezoelectric element 450 may increase which causes the beam structure 430 to exhibit a concave shape or deflect in a first direction. Likewise, when a second input signal is applied to the piezoelectric element 450, the length of the piezoelectric element 450 may decrease which causes the beam structure 430 to exhibit a convex shape or deflect in a second direction.

As described above, in some implementations, the haptic structure described herein may be configured to provide localized haptic output or global haptic output. For example, when providing global haptic output, all of the beam structures in a given area of the haptic structure may be actuated. When providing localized haptic output, one or more beam structures in a given area of the haptic structure may be actuated.

Figure 5A:
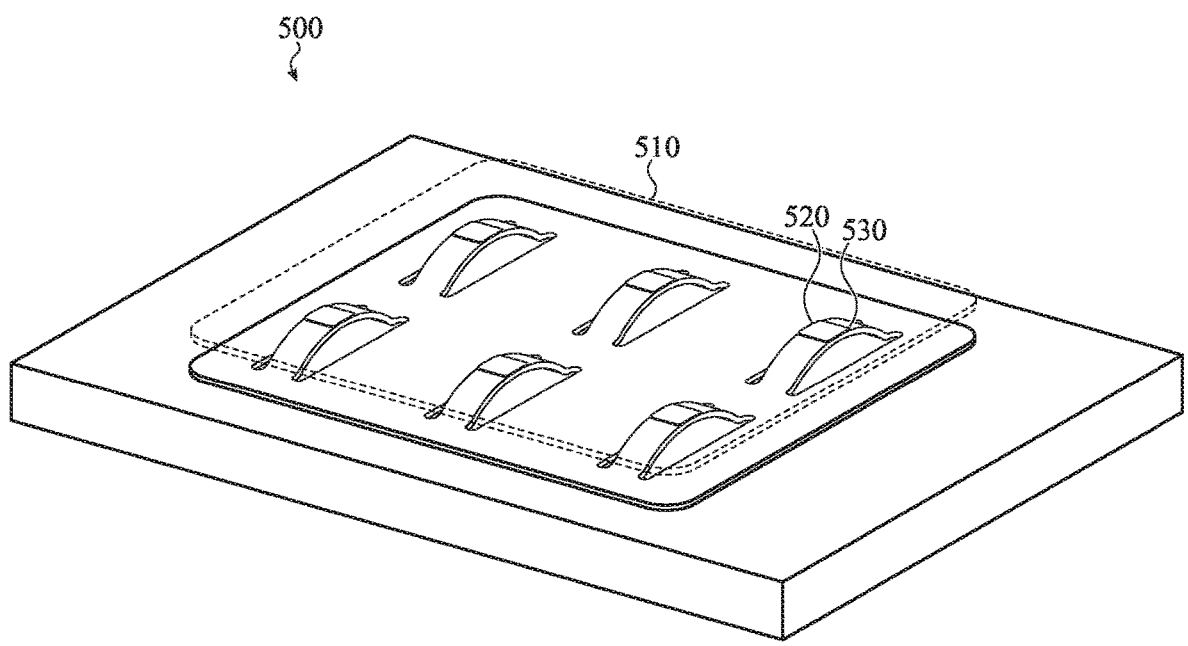
FIG. 5A illustrates example haptic structures in a first operative state.

For example and referring to FIG. 5A, a haptic structure 500 may include one or more beam structures 520. Each of the beam structures 520 may be adhered or otherwise coupled to a surface 510 using one or more spacers 530. In some implementations, the surface may be a cover glass of a display, an input surface of a trackpad, a housing of an electronic device and so on. The surface 510 may also be plastic, acrylic, an alloy material, or other material.

When providing global haptic output, all of the beam structures 520 of the haptic structure may deflect such as shown. In response, the s 510 also deflects or moves in the same direction as the beam structures 520. Although FIG. 5A illustrates the beam structures 520 in a raised or convex configuration, the beam structures 520 may move downward or otherwise have a concave configuration such that the beam structures 520 extend below a surface of the haptic structure 500. In either case, the surface 510 may move along with the beam structure 520 due to the coupling between the spacer 530 and the surface 510.

Although a single surface 510 is shown, each beam structure 520 may be associated with an individual or otherwise unique surface. Thus, as each beam structure 520 is actuated, its corresponding surface 510 may also be moved accordingly. For example, each surface 510 may be an individual key of a keyboard. As the beam structure 520 is actuated, each individual key may move accordingly.

In other implementations, a nominal state of the beam structure 520 may be a state in which the beam structure 520 is concave or convex. When the piezoelectric element is actuated, the beam structure may flatten out or become more concave or convex. This may be useful when rounded surfaces (e.g., a cover glass for a display with a rounded edge and so on) are used. As such, haptic output may be provided on both flat surfaces and rounded surfaces.

Figure 5B:
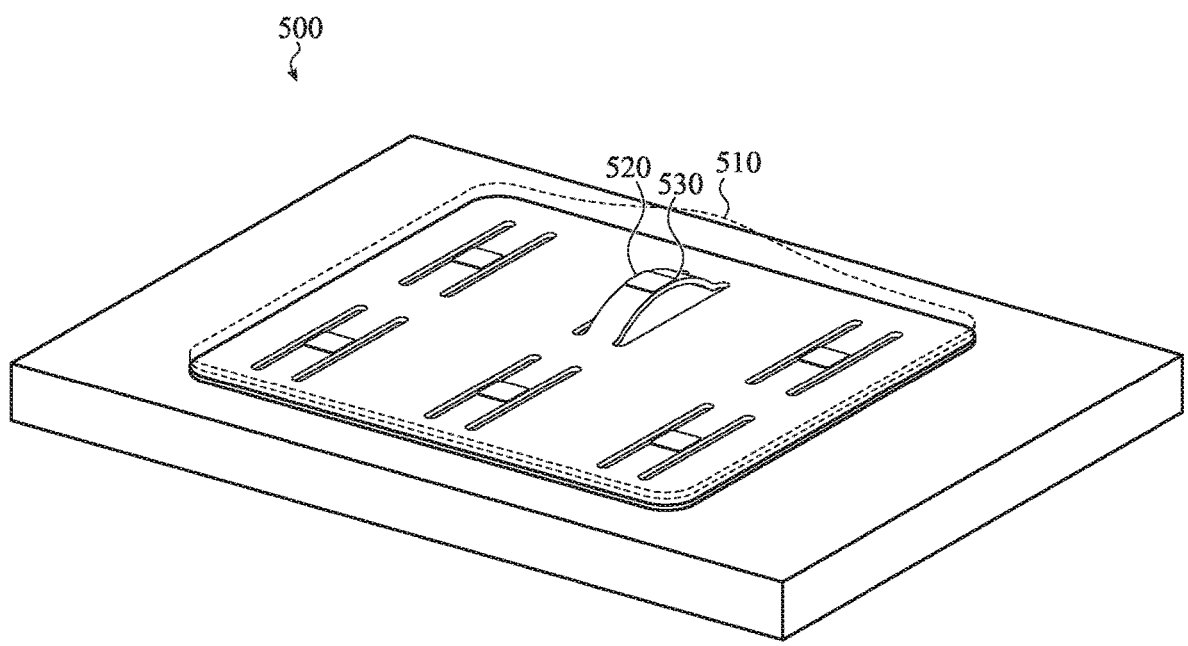
FIG. 5B illustrates a perspective view of the example haptic structures of FIG. 5A in a second operative state.
Figure 5C:
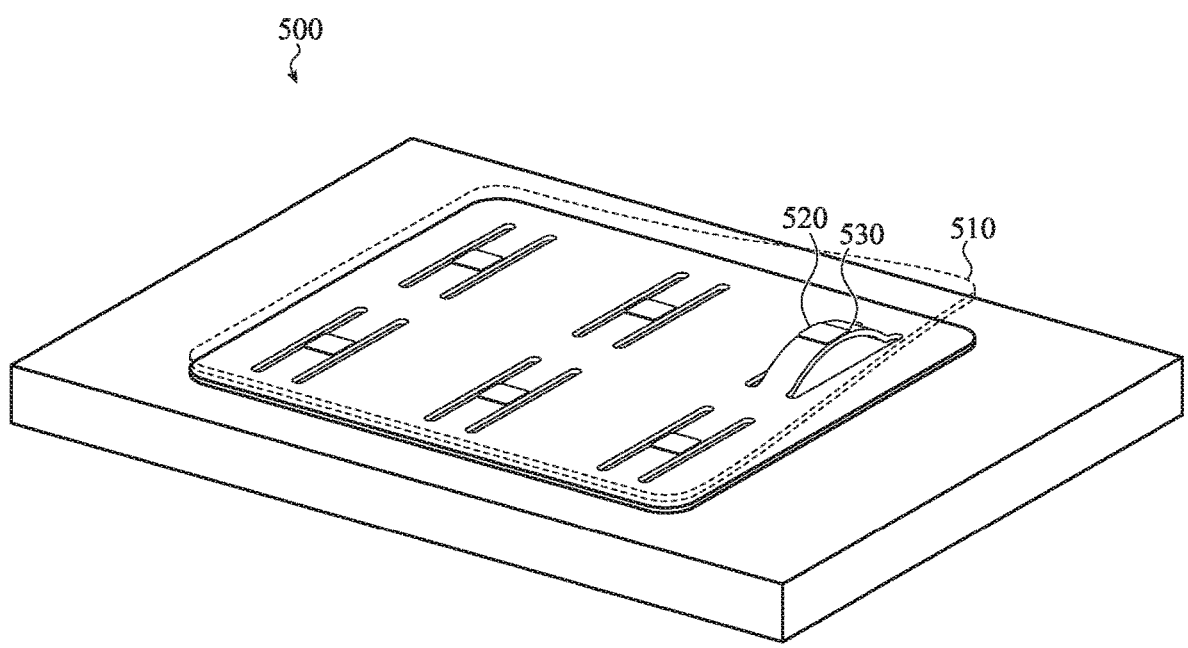
FIG. 5C illustrates a perspective view of the example haptic structures of FIG. 5A in a third operative state.

FIG. 5B and FIG. 5C illustrate the haptic structure 500 providing localized haptic output. For example, in FIG. 5B, a top center beam structure 520 is deflected in response to an input signal being applied to a piezoelectric element associated with the top center beam structure 520. In response, a portion of the surface 510 adjacent to the top center beam structure 520 also deflects and provides a haptic output.

Likewise and as shown in FIG. 5C, a top right beam structure 520 of the haptic structure 500 may be actuated in a similar manner. As a result, a portion of the surface 510 adjacent the beam structure 520 may also deflect in the same direction. Thus, it can be appreciated that a first haptic actuator can generate a haptic output at or through a first part of the input surface, and a second haptic actuator can generate another haptic output at or through a second part of the input surface.

Although the examples shown and described show a single beam structure being actuated, different combinations of beam structures 520 may be actuated simultaneously or substantially simultaneously, or sequentially. In addition, a first beam structure 520 may be actuated in a first direction (e.g., to exhibit a convex shape) while a second beam structure 520 is actuated in a second, opposing direction (e.g., to exhibit a concave shape). In yet other implementations, one beam structure 520 may be actuated at a first location while a different beam structure 520 is actuated at a second location to dampen or enhance the haptic output provided at the first location.

Figure 6A:
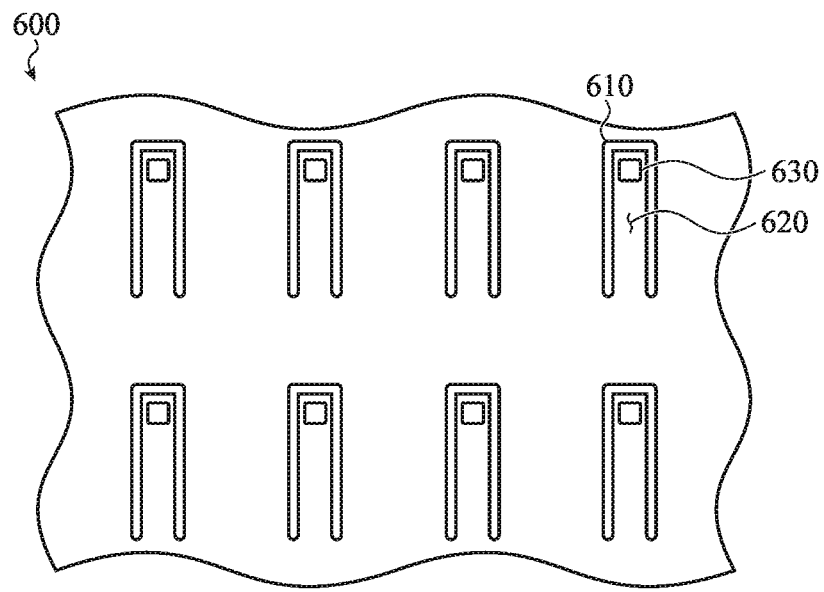
FIG. 6A illustrates a top view of another set of example haptic structure.

FIG. 6A illustrates a top down view of another example haptic structure 600. The haptic structure 600 may include a number of cantilevered beam structures such as described above. More specifically, the haptic structure 600 may include a substrate that defines an aperture 610 that extends around a beam structure 620 such that one end of the beam structure is integrated with the surface of the haptic structure 600 while the other end of the beam structure is not fixed to the surface of the haptic structure 600.

The haptic structure 600 may include a spacer 630. The spacer 630 may function in a similar manner to the spacer 440 described above.

Figure 6B:
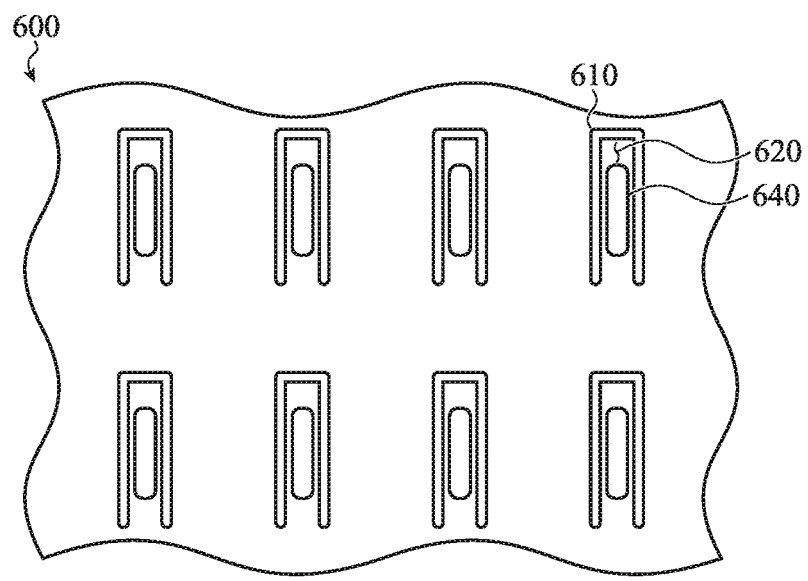
FIG. 6B illustrates a bottom view of the example haptic structures of FIG. 6A.

FIG. 6B illustrates a bottom view of the haptic structure 600. As shown in FIG. 6B, a piezoelectric element 640 may be provided on an underside of each beam structure 620. The piezoelectric element 640 may function in a similar manner to the piezoelectric element 440 described above.

Figure 7A:
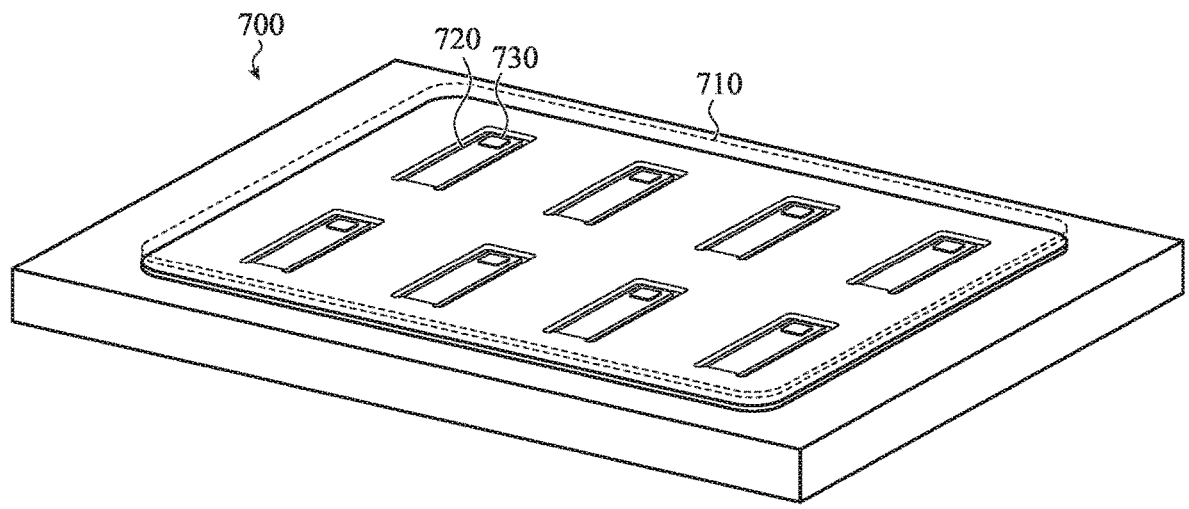
FIG. 7A illustrates still another set of example haptic structures in a first operative state.

FIG. 7A illustrates a perspective view of an example haptic structure 700 in a first operative state. The haptic structure 700 may include one or more cantilevered beam structures 720 coupled to a surface 710 using one or more spacers 730. Like the haptic structure 500 described above, the haptic structure 700 may be configured to provide global haptic output or localized haptic output such as described.

Figure 7B:
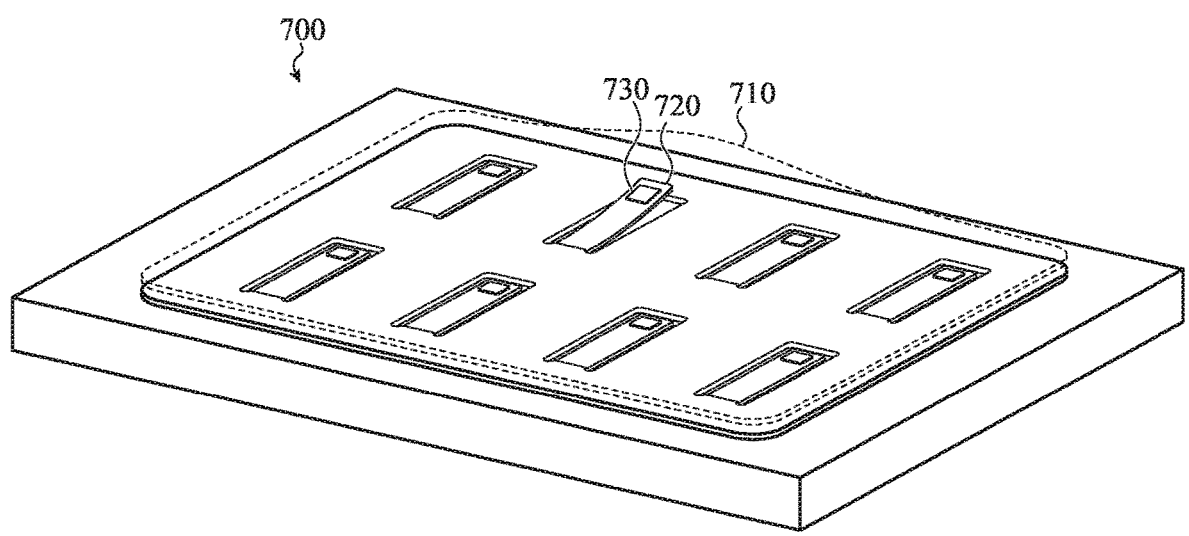
FIG. 7B illustrates a perspective view of the example haptic structures of FIG. 7A in a second operative state.

For example, and referring to FIG. 7B, one or more beam structures 720 may deflect in response to a piezoelectric element of the beam structure 720 being actuated. As the beam structure 720 deflects, the portion of the surface 710 that is adjacent or otherwise coupled to the beam structure 720 may also deflect due to the coupling between the spacer 730, the beam structure 720 and the surface 710.

Figure 8A:
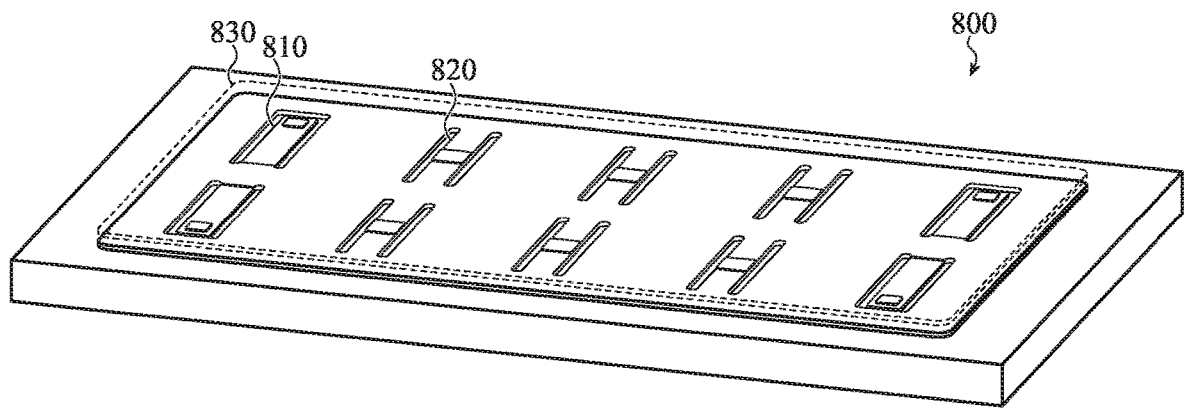
FIG. 8A illustrates yet another set of example haptic structures.

FIG. 8A illustrates a perspective view of another example haptic structure 800. In this embodiment, the haptic structure 800 includes cantilevered beam structures 810 and fixed beam structures 820. Each of the cantilevered beam structures 810 and the fixed beam structures 820 function in a similar manner as described above.

Figure 8B:
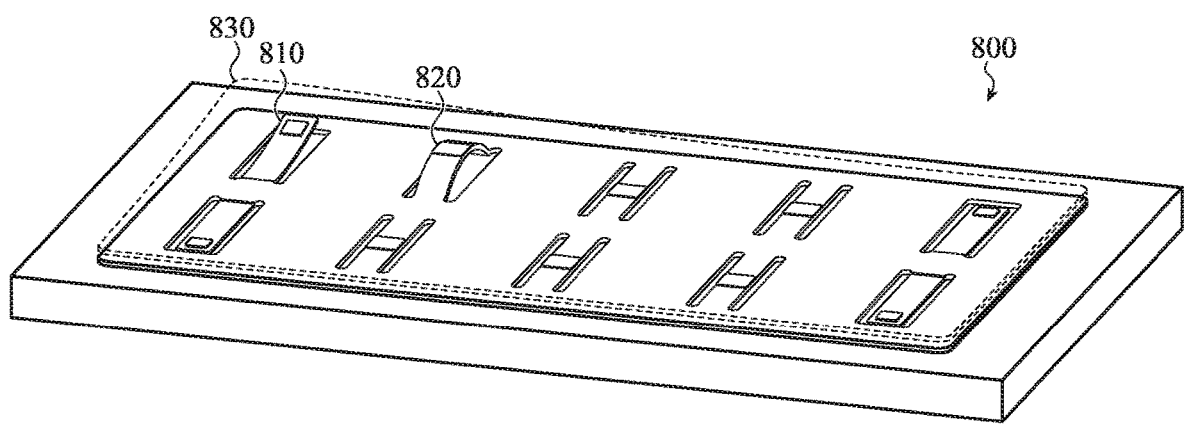
FIG. 8B illustrates the example haptic structures of FIG. 8A in an operative state.

For example, and as shown in FIG. 8B, a cantilevered beam structure 810 may be actuated simultaneously with a fixed beam structure. In some embodiments, the cantilevered beam structure 810 may be placed on a periphery of the haptic structure 800 in order to provide enhanced haptic output near a border or a boundary of the haptic structure 800. The enhanced haptic output may be needed around the periphery of the haptic structure 800 due to various boundary conditions associated with the haptic structure 800. For example, the peripheral portions of a surface may be coupled to the cantilevered beam structure 810 while the fixed beam structure 820 is affixed to a housing of an electronic device, which causes the surface to be more difficult to move at those locations.

The cantilevered haptic structure 810 may be positioned such that the free end of the beam structure is positioned near the periphery such as shown in order to provide a more pronounced haptic output at those locations.

In some embodiments, different combinations of cantilevered beam structures 810 and fixed beam structures 820 may be actuated simultaneously, substantially simultaneously or in sequence. In addition, each of the beam structures may be deflected in the same or different directions. In other embodiments, a first set of beam structures may provide a first type of haptic output (e.g., a discrete haptic output) while a second set of beam structures provide a second type of output (e.g., a continuous haptic output).

Figure 9:
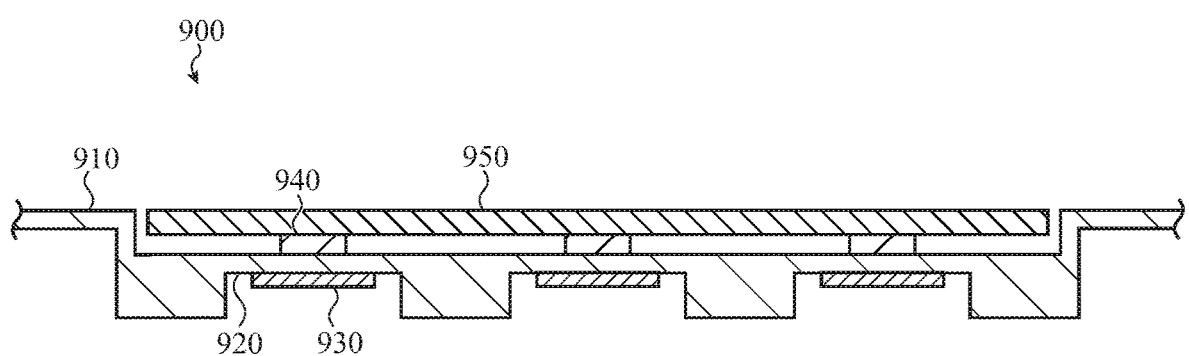
FIG. 9 illustrates a cross-section view of a haptic structure integrated with an electronic device, as taken along line A-A of FIG. 1A.

FIG. 9 illustrates a cross-section view of a haptic structure 900 integrated with an electronic device such as, for example, a keyboard. In this example, the cross-section of the haptic structure 900 may be taken along line A-A of FIG. 1A.

The haptic structure 900, and more specifically, the deflection mechanisms 920 of the haptic structure 900 may be integrated with or otherwise formed in a housing 910 (e.g., a top case) of the electronic device. In some embodiments, the apertures that formed deflection mechanisms 920 are machined out of the housing 910.

As described above, the haptic structure 900 includes an actuation element 930 formed on a first side of the deflection mechanism 920 and a spacer 940 formed on the opposite side of the actuation element 930. The spacer 940 may be adhesively coupled to a surface 950.

When a current is applied to the actuation element 930, the deflection mechanism 920 deflects (e.g., bows or otherwise moves in an upward direction or a downward direction). As the deflection mechanism 920 deflects, the surface 950 moves in a similar manner such as described above.

Figure 10A:
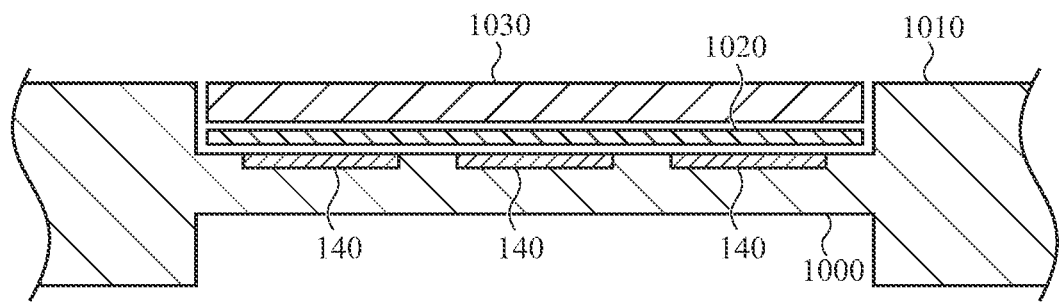
FIG. 10A illustrates a first cross-section view of a haptic structure integrated with a display of an electronic device.
Figure 10B:
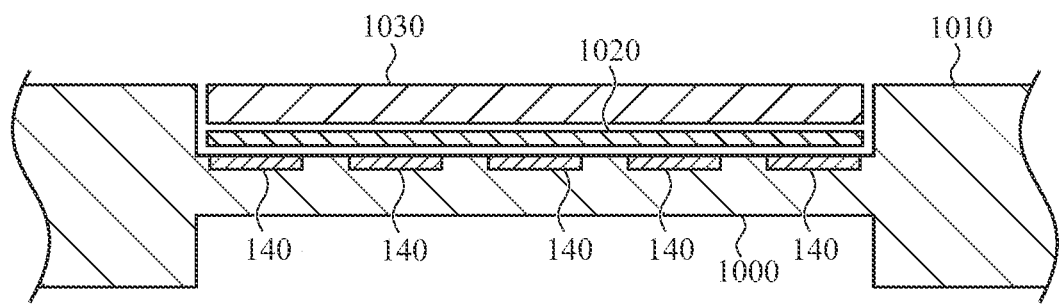
FIG. 10B illustrates a second cross-section view of a haptic structure integrated with a display of an electronic device.

In some cases, the haptic structures may be integrated into a display 110 of an electronic device, such as the laptop computing device 100 shown in FIG. 1. FIGS. 10A and 10B illustrate cross-sectional views of sample haptic structures 140 beneath a display 110 of a computing device 100. In the cross-sectional view of FIG. 10A, multiple haptic actuators 140 of different rows of actuators may be seen. In the cross-sectional view of FIG. 10B, multiple haptic actuators 140, each in different columns, may be seen. Typically, the haptic actuators 140 will operate to bow, bend, or otherwise deflect towards the cover glass 1030 and thus deform the cover glass 1030, as described in more detail below.

Each haptic actuator 140 is disposed on a support 1000 formed from a portion of the laptop housing 1010. In some embodiments, the actuators 140 may rest on (or be part of) beam structures formed from the support 1000 as discussed elsewhere herein.

Generally, the haptic actuators 140 are disposed beneath a display layer 1020 and a cover glass 1030; the display layer 1020 and cover glass 1030 collectively form the display 110 of the electronic device. The display layer may be a LCD display, LED display, OLED display, or any other suitable display. Likewise, the cover glass 1030 may be formed from glass (whether or not chemically strengthened), plastic, sapphire, or any other suitable material.

In the embodiments shown in FIGS. 10A and 10B, the cover glass 1030 and display layer 1020 are both shown as floating with respect to the housing 1010. The cover glass and/or display layer may abut and/or be affixed to the housing in certain embodiments, or they may be separated by a gap as shown. In other embodiments, the display layer and cover glass may abut and/or be affixed to the housing at certain points but float at others.

When a haptic actuator 140 is activated, it may flex, deflect, or otherwise deform as described herein. This operation may, in turn, deflect both the display layer 1020 and the cover glass 1030 upward, thereby providing a haptic output to a user in contact with the cover glass 1030.

Although the cover glass 1030 and display layer 1020 both deform, this deformation may not be visually perceptible as it may be too small to see. In other embodiments, the deformation may be visually perceptible but typically covered by a user's finger, a stylus, or other object receiving haptic feedback through the cover glass.

Figure 11:
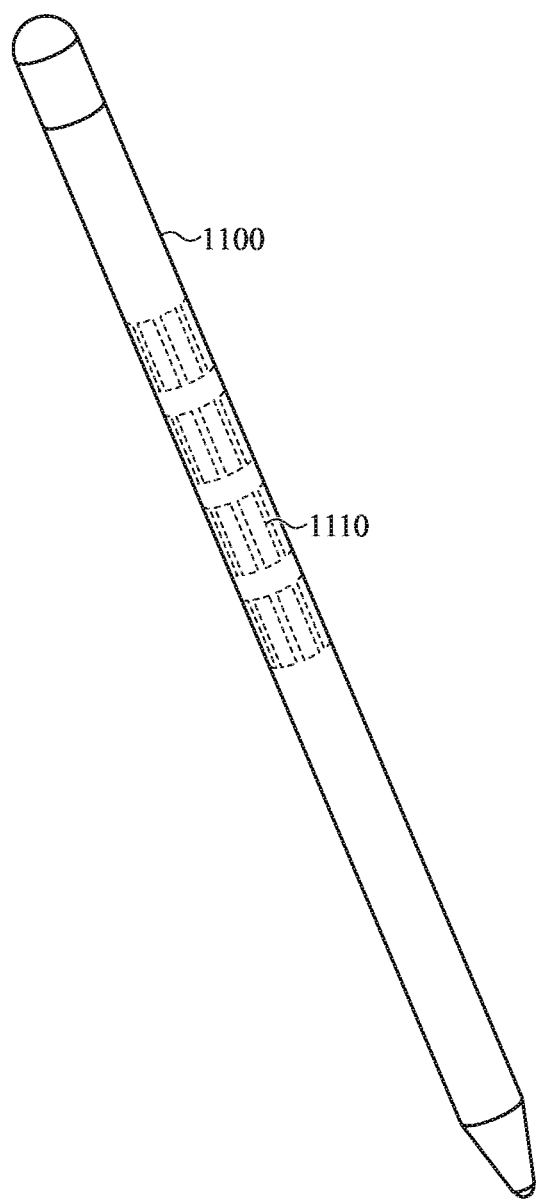
FIG. 11 illustrates haptic structures integrated into a sample input device, in this case a stylus.

It should be appreciated that embodiments described herein may be used in any number of different electronic devices. For example, FIG. 11 illustrates a stylus 1100 that incorporates a set of haptic structures 1110. The haptic structures may be within the body of the stylus 1100, or on its exterior. The haptic structures may be formed on or attached to a substrate within the body, on an interior or exterior of the sidewall, and so on. Regardless of location, the haptic structures 1110 may provide a haptic output (and thus tactile sensation) to a person gripping, touching, or otherwise interacting with the stylus.

Figure 12:
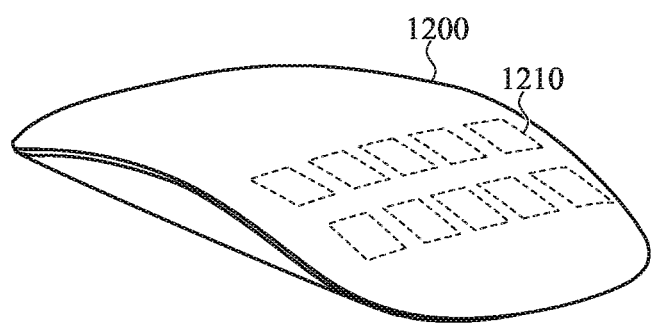
FIG. 12 illustrates haptic structures integrated into a sample input device, in this case a mouse.

Likewise, FIG. 12 illustrates a mouse 1200 that incorporates multiple haptic structures 1210 in place of buttons. The haptic structures may simulate the "click" or a traditional mouse button or may provide more complex and/or sophisticated feedback. In some embodiments, a force applied to the exterior of the mouse 1200 may cause the haptic structures 1210 to deform, thereby generating an electrical signal from or in a piezoelectric element of the haptic structure. The magnitude of this electrical signal may vary with the exerted force, insofar as greater forces may deflect or deform the piezoelectric element more than weaker forces. Thus, the haptic structure 1210 may also receive input from a user in a manner similar to a dome switch or other switch element, but may have the additional benefit of measuring non-binary forces. The various haptic structures described herein may thus be used as both input and output mechanisms.

In yet other embodiments, haptic structures may be incorporated into an output surface that does not also accept touch or force input. In yet other embodiments, a wearable device (such as a watch) may incorporate sample haptic structures as described herein on a portion of the wearable device in contact with a user's skin when worn. The haptic structures may actuate to provide the output to the user's skin. Such haptic structures may be on the inside of a band, back of a watch body, and so on.

Accordingly, it should be appreciated that any of a variety of electronic devices may incorporate haptic structures described herein.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device comprising:
a display portion comprising a display;
a housing pivotally coupled with the display portion and comprising a glass sheet defining an input surface of the electronic device, the input surface defining a keyboard having a set of key regions arranged along the input surface; and
a haptic mechanism positioned beneath the glass sheet and comprising:
a substrate having a pair of elongated holes and a beam structure defined between the pair of elongated holes, the beam structure having a beam length that extends from a first fixed end to a second fixed end;
a spacer positioned along a first side of the beam structure and between the substrate and the key region, the spacer coupling the beam structure to the glass sheet; and
a piezoelectric element positioned along a second side of the beam structure and having a piezo length that extends along the beam length of the beam structure; wherein:
the piezoelectric element is configured to deflect the beam structure and locally deform the glass sheet at the key region to provide haptic output along the input surface in response to an input received along the key region.

2. The electronic device of claim 1, wherein the key region is located above a portion of the substrate that is between the pair of elongated holes.

3. The electronic device of claim 1, wherein the haptic mechanism is configured to detect the input at the key region of the input surface in response to a downward deflection of the beam structure caused by the input.

4. The electronic device of claim 1, wherein:
the haptic output is a first haptic output that results from the beam structure being deflected in a first direction; and
the piezoelectric element is configured to deflect the beam structure in a second direction to provide a second haptic output along the input surface.

5. The electronic device of claim 1, wherein:
the haptic mechanism is a first haptic mechanism;
the key region is a first key region;
the haptic output is a first haptic output; and
the electronic device further comprises a second haptic mechanism positioned beneath a second key region of the set of key regions; wherein:
the first haptic mechanism provides the first haptic output at the first key region; and
the second haptic mechanism provides a second haptic output at the second key region.

6. The electronic device of claim 5, wherein the first haptic mechanism is operable to deflect independently of the second haptic mechanism.

7. The electronic device of claim 1, wherein the pair of elongated holes are parallel to each other.

8. A portable computer comprising:
a display portion comprising a display; and
a housing defining an interior volume and pivotally coupled with the display portion, the housing comprising:
a cover glass defining a touch-sensitive input surface defining a virtual keyboard;
a substrate positioned below the cover glass, the substrate defining a pair of elongated slits and a beam structure defined, in part, by the pair of elongated slits, the beam structure extending from a first fixed end to a second fixed end, the beam structure having a first surface facing the cover glass and a second surface facing the interior volume;
a spacer positioned between the first surface and the cover glass, the spacer coupling the beam structure to the cover glass; and
a piezoelectric element coupled to the second surface and operable to cause the beam structure to deflect and thereby causing a localized deflection of the cover glass in response to a touch input to the virtual keyboard.

9. The portable computer of claim 8, wherein:
the virtual keyboard defines an array of key regions; and
the substrate defines an array of beam structures, each beam structure of the array of beam structures positioned below a respective key region of the array of key regions.

10. The portable computer of claim 8, wherein:
the pair of elongated slits are parallel to each other.

11. The portable computer of claim 8, wherein:
in response to receiving the touch input, a length of the piezoelectric element is configured to change; and
in response to the length of the piezoelectric element changing, the piezoelectric element is configured to deflect in a direction that is transverse to the length of the piezoelectric element.

12. The portable computer of claim 11, wherein:
the piezoelectric element is a first piezoelectric element;
the portable computer further comprises a set of piezoelectric elements;
the virtual keyboard defines a set of key regions; and each piezoelectric element of the set of piezoelectric elements is positioned under a respective key region of the set of key regions.

13. The portable computer of claim 12, wherein a first piezoelectric element of the set of piezoelectric elements is configured to deflect independently of other piezoelectric elements of the set of piezoelectric elements.

14. An electronic device comprising:
a display portion comprising a display; and
a housing pivotally coupled with the display portion, the housing comprising:
  a cover glass defining a first key region and a second key region adjacent the first key region;
  a substrate defining:
    a first deflection mechanism below the first key region and having first and second fixed ends;
    a first opening extending through the substrate and positioned along a first side of the first deflection mechanism; and
    a second opening extending through the substrate and positioned along a second side of the first deflection mechanism;
  a second deflection mechanism below the second key region
    a third opening extending through the substrate and positioned along a first side of the second deflection mechanism; and
    a fourth opening extending through the substrate and positioned along a second side of the second deflection mechanism;
  a first piezoelectric element coupled to a first side of the first deflection mechanism;
  a second piezoelectric element coupled to a first side of the second deflection mechanism;
  a first spacer coupled to a second side of the first deflection mechanism between the substrate and the cover glass and coupling the first deflection mechanism to the cover glass; and
  a second spacer coupled to a second side of the second deflection mechanism between the substrate and the cover glass and coupling the second deflection mechanism to the cover glass;
wherein:
  the first deflection mechanism is configured to locally deflect the cover glass along the first key region; and
  the second deflection mechanism is configured to locally deflect the cover glass along the second key region.

15. The electronic device of claim 14, wherein the cover glass is configured to locally deflect in an outward direction in response to an input received along a surface of the cover glass.

16. The electronic device of claim 15, wherein the first deflection mechanism is configured to locally deflect the cover glass along the first key region independently of the second deflection mechanism locally deflecting the cover glass along the second key region.

* * * * *